United States Patent
Mulcahy et al.

(10) Patent No.: US 9,516,794 B2
(45) Date of Patent: Dec. 6, 2016

(54) MODULAR SCALABLE LIQUID COOLED POWER SYSTEM

(71) Applicant: Transistor Devices, Inc., Hackettstown, NJ (US)

(72) Inventors: Gary Mulcahy, Flanders, NJ (US); Tunc Icoz, Bridgewater, NJ (US)

(73) Assignee: Transistor Devices, Inc., Hackettstown, NJ (US)

( * ) Notice: Subject to any disclaimer, the term of this patent is extended or adjusted under 35 U.S.C. 154(b) by 0 days.

(21) Appl. No.: 14/928,401

(22) Filed: Oct. 30, 2015

(65) Prior Publication Data

US 2016/0128239 A1  May 5, 2016

Related U.S. Application Data

(60) Provisional application No. 62/073,204, filed on Oct. 31, 2014.

(51) Int. Cl.
*H05K 7/20* (2006.01)

(52) U.S. Cl.
CPC ................. *H05K 7/20927* (2013.01)

(58) Field of Classification Search
CPC ............ H05K 7/20927; H05K 7/20909; H05K 7/20945
See application file for complete search history.

(56) References Cited

U.S. PATENT DOCUMENTS

| | | | |
|---|---|---|---|
| 1,621,742 A | 3/1927 | Kessler | |
| 1,818,387 A | 8/1931 | Dinzl | |
| 1,929,824 A | 10/1933 | Polley | |
| 2,743,347 A | 4/1956 | Porter | |
| 3,865,183 A | 2/1975 | Roush | |
| 3,904,933 A | 9/1975 | Davis | |
| 5,059,404 A | 10/1991 | Mansour et al. | |
| 5,159,529 A | 10/1992 | Lovgren et al. | |
| 5,251,097 A * | 10/1993 | Simmons | G06F 13/409 |
| | | | 361/679.53 |
| 5,461,542 A | 10/1995 | Kosak et al. | |
| 5,829,516 A | 11/1998 | Lavochkin | |
| 5,909,358 A | 6/1999 | Bradt | |
| 6,031,751 A | 2/2000 | Janko | |
| 6,213,195 B1 | 4/2001 | Downing et al. | |

(Continued)

FOREIGN PATENT DOCUMENTS

WO  0235898 A1  5/2002

OTHER PUBLICATIONS

White Paper TW0055, "Next Generation Military Vehicle Power Conversion Modules", published in Mar. 2008 by TDI Sower (Transistor Devices, Inc.).

*Primary Examiner* — Jue Zhang
(74) *Attorney, Agent, or Firm* — Brown & Michaels, PC

(57) ABSTRACT

A scalable liquid cooled power system using a number of modularized, hot-plug, hot-swap, and scalable liquid-cooled power conversion modules mounted on mating mounting assemblies. A modularized, scalable liquid coolant manifolds and liquid cooling management system provides coolant circulation through the power conversion modules. The system optionally includes a highly scalable system control and administration system, and optionally provides the facility for on-board liquid-to-air heat exchanger system, or off-board cooling using an external heat exchanger system.

10 Claims, 10 Drawing Sheets

(56) References Cited

U.S. PATENT DOCUMENTS

| | | |
|---|---|---|
| 6,326,761 B1 | 12/2001 | Tareilus |
| 6,333,849 B1 | 12/2001 | Donahoe et al. |
| 6,828,675 B2 | 12/2004 | Memory et al. |
| 7,286,355 B2 | 10/2007 | Cheon |
| 7,320,359 B2 | 1/2008 | Miettinen et al. |
| 7,450,384 B2 | 11/2008 | Tavassoli et al. |
| 7,552,758 B2 | 6/2009 | Garner et al. |
| 7,624,791 B2 | 12/2009 | Strobel et al. |
| 7,710,723 B2 | 5/2010 | Korich et al. |
| 8,477,498 B2 | 7/2013 | Porreca et al. |
| 2003/0106681 A1 | 6/2003 | Hauri et al. |
| 2004/0060692 A1* | 4/2004 | Pfeifer ............... H02M 7/003 361/704 |
| 2005/0241806 A1 | 11/2005 | Liu |
| 2007/0133171 A1 | 6/2007 | Cheon |
| 2008/0088186 A1* | 4/2008 | Hammond ............ H02M 7/49 307/125 |
| 2008/0218970 A1 | 9/2008 | Kehret et al. |
| 2009/0021922 A1* | 1/2009 | Popp ................... H05K 3/325 361/752 |
| 2009/0229283 A1* | 9/2009 | Marsala ............ H05K 7/20809 62/119 |
| 2010/0044023 A1 | 2/2010 | Canales et al. |
| 2010/0073970 A1* | 3/2010 | Abolhassani ........... H01F 30/12 363/37 |
| 2011/0044010 A1* | 2/2011 | Ledezma ............ H02M 7/003 361/727 |

* cited by examiner

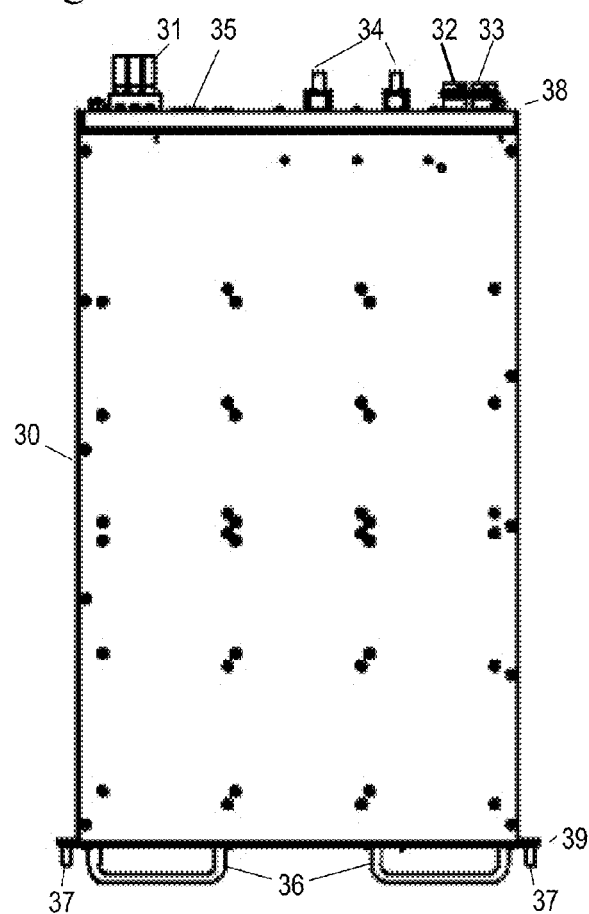
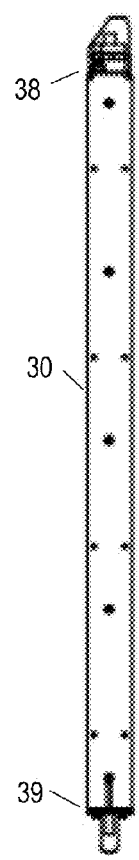
Fig. 3a
Fig. 3d
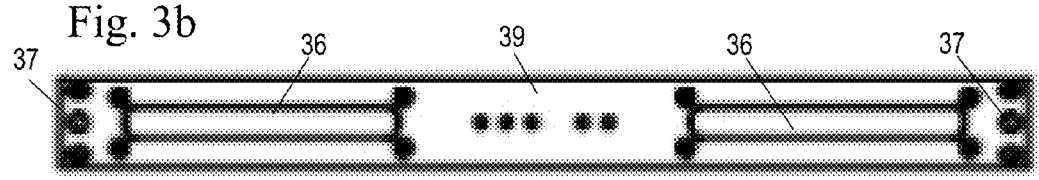
Fig. 3b
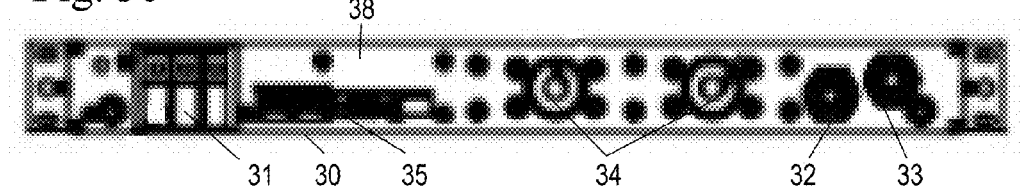
Fig. 3c

MODULAR SCALABLE LIQUID COOLED POWER SYSTEM

REFERENCE TO RELATED APPLICATIONS

This application claims one or more inventions which were disclosed in Provisional Application No. 62/073,204, filed Oct. 31, 2014, entitled "Modular Scalable Liquid Cooled Power System". The benefit under 35 USC §119(e) of the United States provisional application is hereby claimed, and the aforementioned application is hereby incorporated herein by reference.

BACKGROUND OF THE INVENTION

Field of the Invention

The invention pertains to the field of cooling electronic systems. More particularly, the invention pertains to methods of cooling electronics using circulating liquid.

Description of Related Art

Electronic systems that involve a significant amount of heat generation as part of their functionality, or are deployed in an area that subjects them to environmental contamination, or are deployed in areas that require a low acoustical noise signature, oftentimes require liquid cooling. Liquid cooling also can provide the opportunity to significantly reduce overall system size and cost.

Liquid cooling can be realized via several different methods. For example, heat that is dissipated into the local system environment via convection can be transferred to a localized air-to-liquid heat exchanger. Alternatively, heat from electronic components can be transferred directly to liquid coolant via conduction.

When conduction cooling is employed, the general state of the art is to use assemblies that are plumbed in place to the host system's liquid coolant distribution and management system. Such assemblies are typically difficult to repair after a malfunction as they have to be disconnected from the cooling system.

Condensation is a risk in liquid cooled applications where the coolant is supplied from a source that provides coolant at temperatures below the dew point. This can cause sensitive electronic parts to fail and leaves the system unserviceable. Adequate condensation mitigation techniques should be in place to prevent condensation happening in the vicinity of electronic components.

Likewise, the sub-system cabinet these assemblies are contained within is highly customized, providing limited flexibility regarding system expansion or upgrade. With power conversion systems in particular, the ability for a flexible, easy-to-maintain and cost effective architecture is highly desirable. Flexibility areas include setting the amount of power available for a given application, the liquid cooling system, input power management and distribution system, output power management and distribution system, and administrative functions.

SUMMARY OF THE INVENTION

The scalable liquid cooled power system of the invention provides a system architecture using a number of modularized, hot-plug, hot-swap, and scalable liquid-cooled power conversion modules mounted on mating mounting assemblies. A modularized, scalable liquid coolant manifolds and liquid cooling management system provides coolant circulation through the power conversion modules. The system optionally includes a highly scalable system control and administration system, and optionally provides the facility for on-board liquid-to-air heat exchanger system, or off-board cooling using an external heat exchanger system.

BRIEF DESCRIPTION OF THE DRAWING

FIGS. 3a-3d show top, front, back and side views of a blind-mate liquid cooled power module, respectively.
FIG. 7b shows the functional data flow of the system of FIG. 7a.

DETAILED DESCRIPTION OF THE INVENTION

Figure 1:
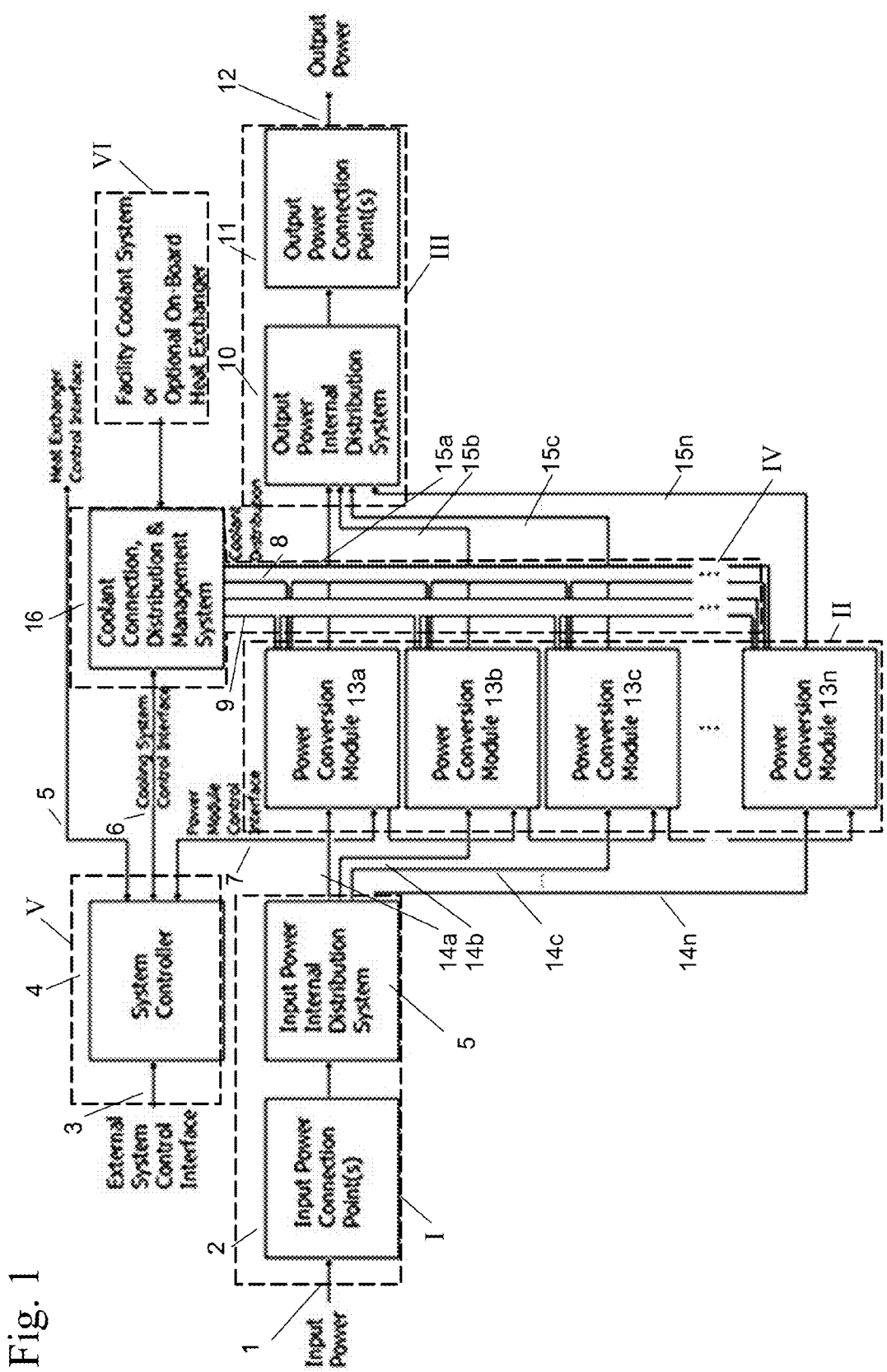
FIG. 1 shows how the modular blocks are configured.

As shown in dashed lines in the block diagram of FIG. 1, the Modular Scalable liquid-cooled power system is built around the following major functional blocks:

I. Input power connection and input power internal distribution system
II. Modular—blind mate, hot plug power conversion modules configured as blocks. In general, the scalable liquid cooled power system is set to support modular power converters in blocks of up to eight (8) modules 13a . . . 13n, although other cluster sizes are possible.
III. Output power connection and output power internal distribution system
IV. Liquid coolant system
V. Control and administration system
VI. Optional liquid-to-air heat exchanger system FIG. 1 presents how these blocks are configured for the system.

Block No. I, the Input Power Connection and Distribution System, comprises an input power connection point 2, which accepts the input power connection 1 of a size and amperage appropriate to the power being delivered. This power connection is then broken into separate feeds 14a, 14b, 14c . . . 14n, by the Input Power Internal Distribution System 5. The individual feeds 14a, 14b, 14c . . . 14n each feed one of the individual power modules 13a, 13b, 13c . . . 13n.

Figure 2:
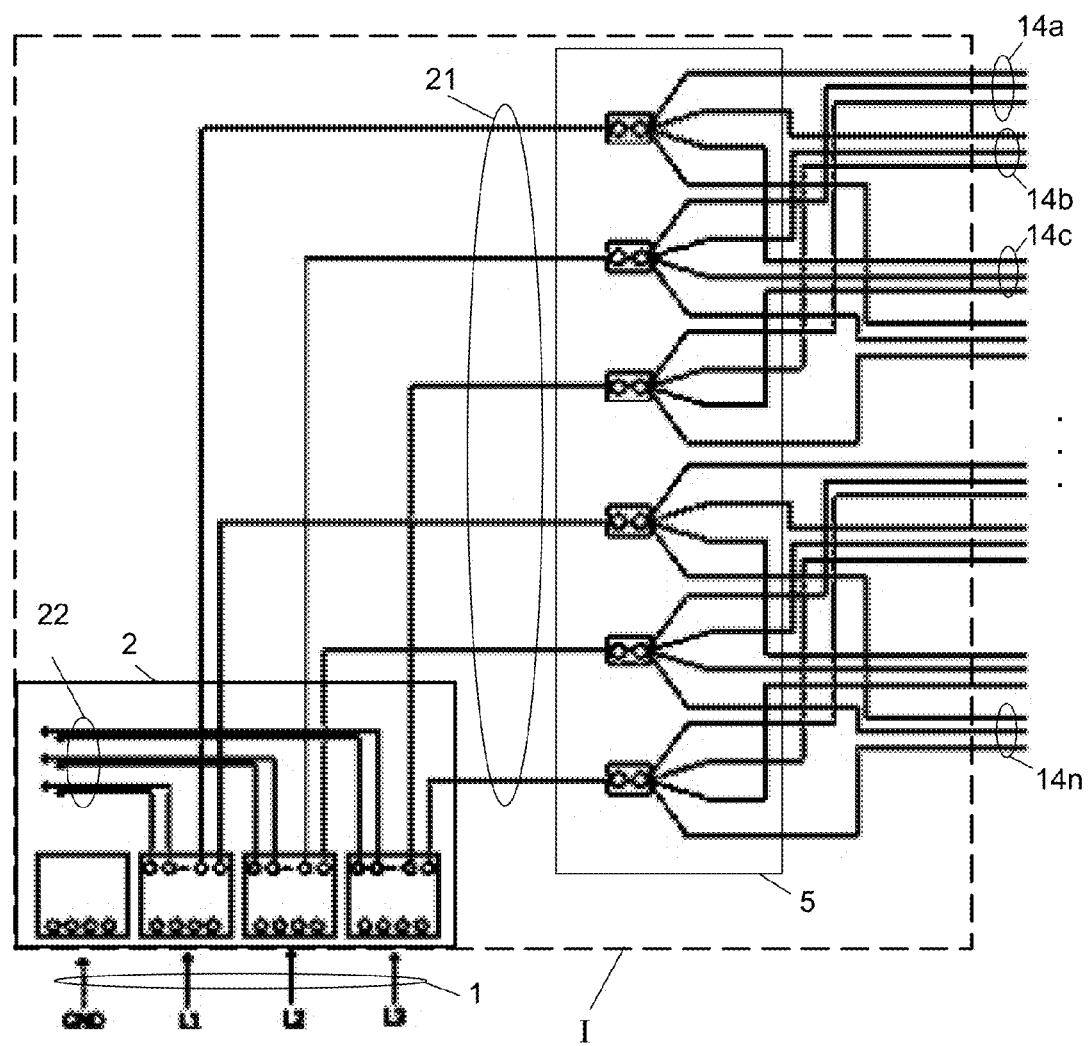
FIG. 2 shows a detail of power connections from box I in FIG. 1.

FIG. 2 shows a detail of block I. This arrangement provides for practical sizing of AC input conductors 1, allowing for extreme versatility of the main AC input feeder, where this can be cables or bus bars. Intermediate cables 21 are sized to provide cordage that is manageable from the weight, bend radius and cost aspects. Other controllers may be linked in through connections 22.

Block No. II comprises a plurality of Modular—blind mate, hot plug power conversion modules 13a, 13b, 13c . . . 13n, configured as blocks. The power conversion modules 13a-13n are liquid cooled through coolant from the coolant connection distribution and management system 16 by supply line 8 and coolant return line 9. Input power is supplied to each module 13a-13n by individual feeds 14a-14n, and output power produced by the modules 13a-13n is supplied to output power internal distribution system 10 in functional block III, discussed below, through individual outputs 15a, 15b, 15c . . . 15n. The modules 13a-13n are connected to a control bus 7 from system controller 4, as will be discussed in greater detail below.

FIGS. 3a to 3d present top, side, front and back views of a typical module 30, which can be used interchangeably as any of the modules 13a-13n shown in FIG. 1. As shown in FIGS. 3a and 3c, the back panel 38 of the case of each module 30 has blind-mate connectors for power input 34, power output 31 and control 35. The module 30 also has connectors for coolant input 32 and coolant output 33 on the back panel 38, through which coolant can circulate. The front panel 39 of the module 30 can be fitted with handles 36 and fixing screws 37, as is conventional in rack-mount electronics.

Figure 11:
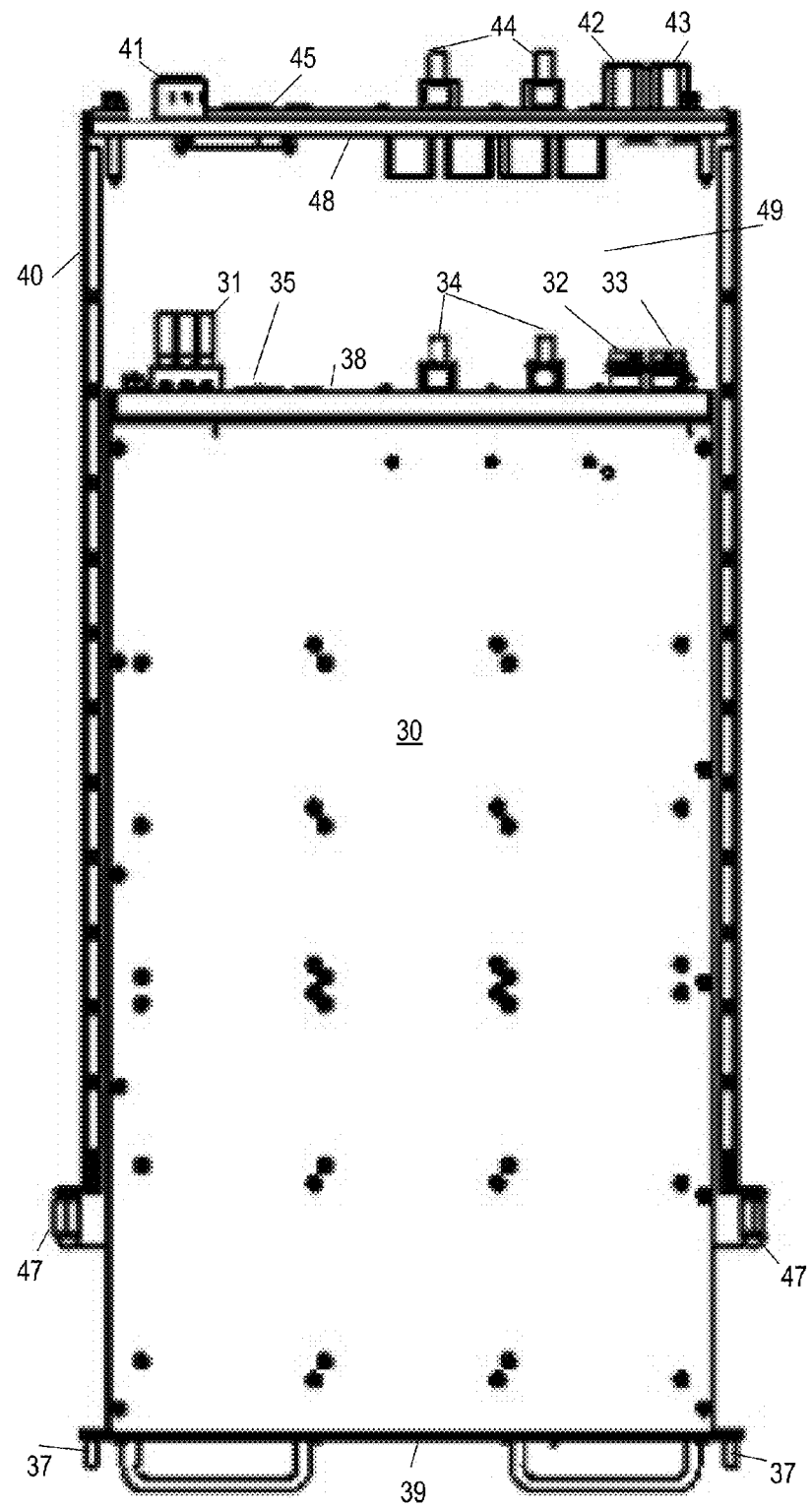
FIG. 11 shows a cabinet mounting assembly with a module as shown in FIGS. 3a-3d.

FIG. 11 shows a cabinet mounting assembly 40 for use with the module 30 detailed in FIGS. 3a-3c, with a module 30 partially inserted into the assembly 40. The mounting assembly 40 has a shelf portion 49 for supporting the module 30. Threaded connectors 47 are provided into which the fixing screws 37 on the front panel 39 of the module 30 can be screwed to secure the module 30 in the mounting assembly 40 after the module 30 has been fully inserted into the mounting assembly 40.

A back plane 48 of the mounting assembly 40 has blind-mate connectors 41-45 which match the blind-mate connectors 31-35 on the back panel 38 of the module 30. Through this arrangement, when the module 30 is fully seated in the mounting assembly 40 by being slid completely to the rear, the connectors 31-35 on module 30 make secure connection to connectors 41-45 on mounting assembly 40.

In this way, coolant from the coolant connection distribution and management system 16 is supplied to module 30 through coolant supply line 8 to liquid coolant input connector 42 on the mounting assembly 40 and then through liquid coolant input connector 32 to module 30. Returned coolant from module 30 exits through liquid coolant output connector 33 into liquid coolant output connector 43, and then back to the coolant connection distribution and management system 16 through coolant return line 9.

One of the power input lines 14a-14n would be connected to power input connector 41 on the mounting assembly, which would supply power to module 30 through mating power input connector 31. Power output from module 30 would be supplied to power output connector 34, which would mate with power output connector 44 on the mounting assembly 40, which in turn would be connected to one of the power output lines 15a-15n.

Finally, control signals from system controller 4 would be supplied on control line 7 to control connector 45 on the mounting assembly 40, which mates with control connector 35 on the module 30.

It will be understood that the specific connectors and connections shown in the figure are for illustrative purposes, and alternative or additional connectors may be provided, and the connectors arranged in different arrangements, within the teachings of the invention.

Figure 4:
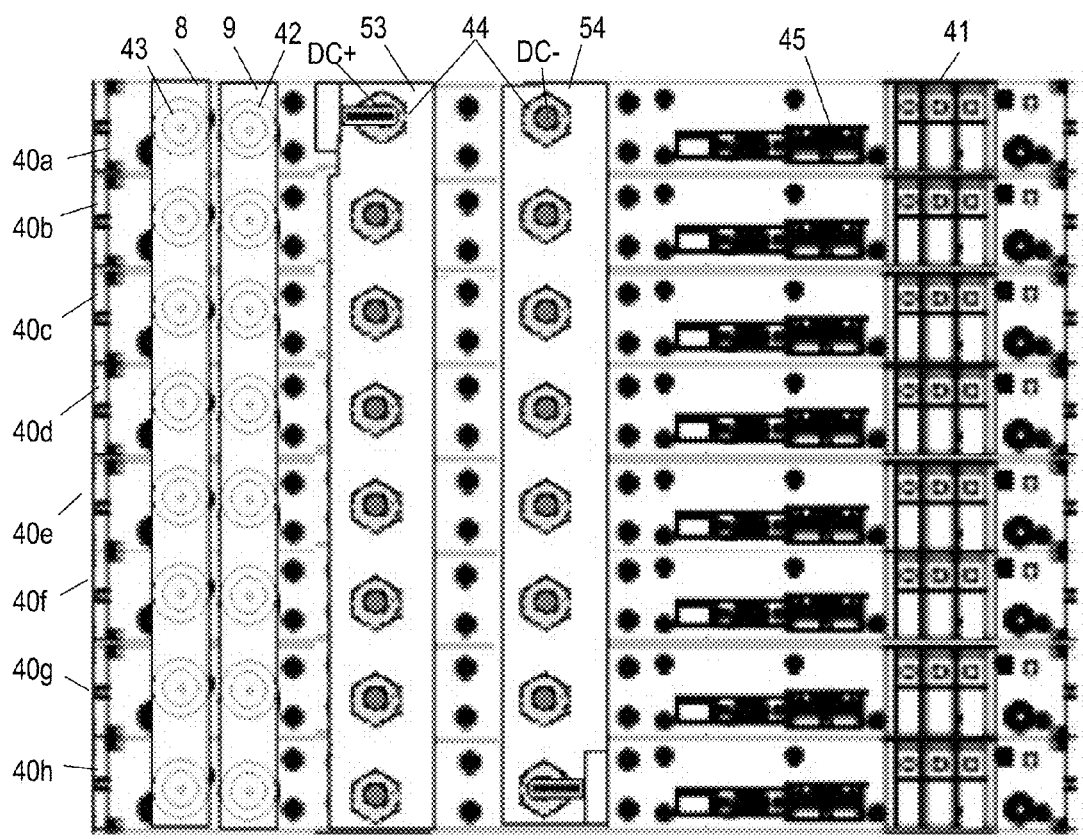
FIG. 4 shows a rear view of an eight unit cluster of modules.

FIG. 4 shows a rear view of an 8-unit cluster of mounting assemblies 40a-40h. Each of the mounting assemblies 40a-40h has a coolant input connector 42 and coolant output connector 43. All of the coolant input connectors 42 are fed by coolant supply manifold 8 running along the back of the cluster, and all of the coolant output connectors 43 feed into coolant return manifold 9. Each of the mounting assemblies 40a-40h has its power output connectors 44, with the positive DC+ connected to bus 53 and the negative DC- connected to bus 54. The power input connectors 41 on each mounting assembly 40a-40h can be connected in parallel, or individual lines 14a-14h provided as in FIG. 1. Finally, each mounting assembly 40a-40h has its control input 45 available for connection to the system controller 4. If desired, the control inputs 45 can be daisy chained together or connected in parallel to a communications bus, as is known to the art.

Block No. III comprises the output power connection point 11 and output power internal distribution system 11. Power from the individual power conversion modules 13a-13n is supplied to the output power internal distribution system 11 through lines 15a-15n. The combined power of the power conversion modules 13a-13n is supplied to the output power connection point 11, which then supplies output power 12 to external components as needed.

Figure 5:
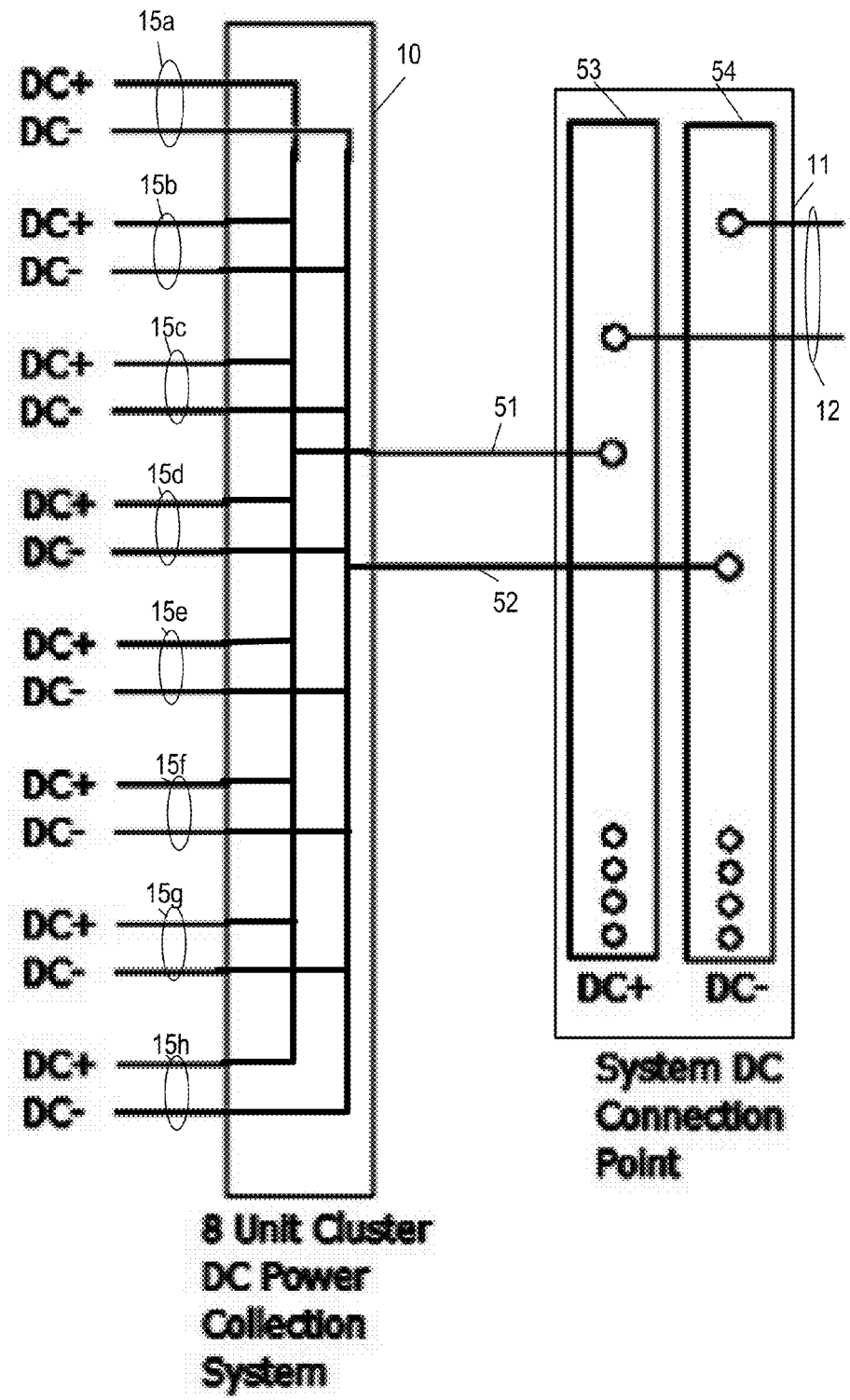
FIG. 5 shows a DC power connection and distribution electrical schematic for a system of modules.

FIG. 5 provides a schematic depiction of block III, in an example embodiment with eight modules. In this example, the output power lines 15a-15h from the modules each comprise a positive (DC+) and negative (DC-) wire. The DC+ wires from lines 15a-15h are combined in power collection system 10 into a single line 51, which supplies DC+ bus 53 in the system DC connection point 11, and this bus 53 provides positive voltage to the system power output 12. Similarly, The DC- wires from lines 15a-15h are combined in power collection system 10 into a single line 52, which supplies DC- bus 54 in the system DC connection point 11, and this bus 53 provides negative voltage to the system power output 12.

Block No. IV is the Liquid coolant system, in which the Coolant Connection, Distribution and Management System 16 supplies coolant to coolant supply manifold 8, and accepts the warmed coolant back through coolant return manifold 9. The Coolant Connection, Distribution and Management system 16 can be monitored and controlled by the system controller 4 through a Cooling System Control Interface 6.

Figure 6:
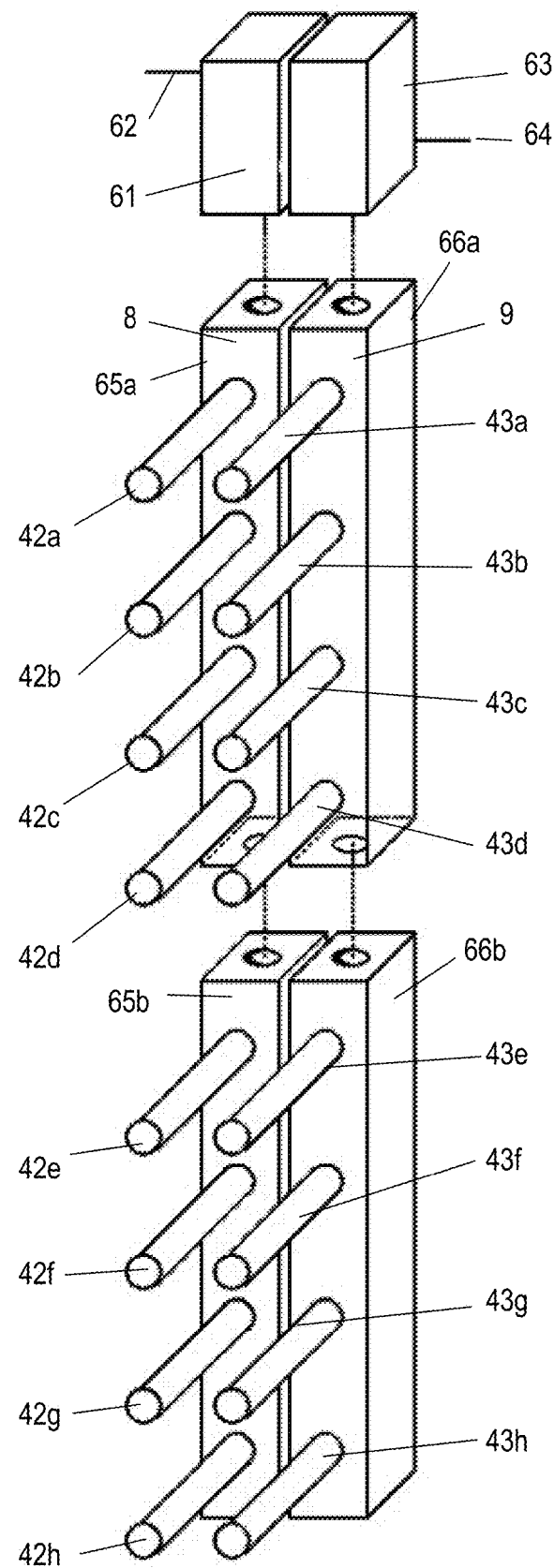
FIG. 6 shows a block diagram of a coolant manifold system.

As depicted in FIG. 6, coolant supply manifold 8 is preferably built up of modular scalable manifolds 65a and 65b that can be assembled together to form the manifold 8. Similarly, coolant return manifold 9 is preferably built up of modular scalable manifolds 66a and 66b that can be assembled together to form the manifold 9. Also shown in FIG. 6 are optional flow control solenoid 63, controlled by line 64 from the cooling system control interface 6, and optional pressure sensor 61 which sends pressure data by line 62 to the cooling system control interface 6. The cooling system control interface 6 is controlled by or reports back to the system controller described in Block No. V, below.

Block No. V, the Control and administration system, consists of an electronic power system control module 4 that communicates over module control line 7 to the power converter modules 13a-13n. The module control line 7 is preferably a serial digital communication bus operating a communications protocol known to the art, such as the Controller Area Network (CAN) BUS protocol.

Figure 7A:
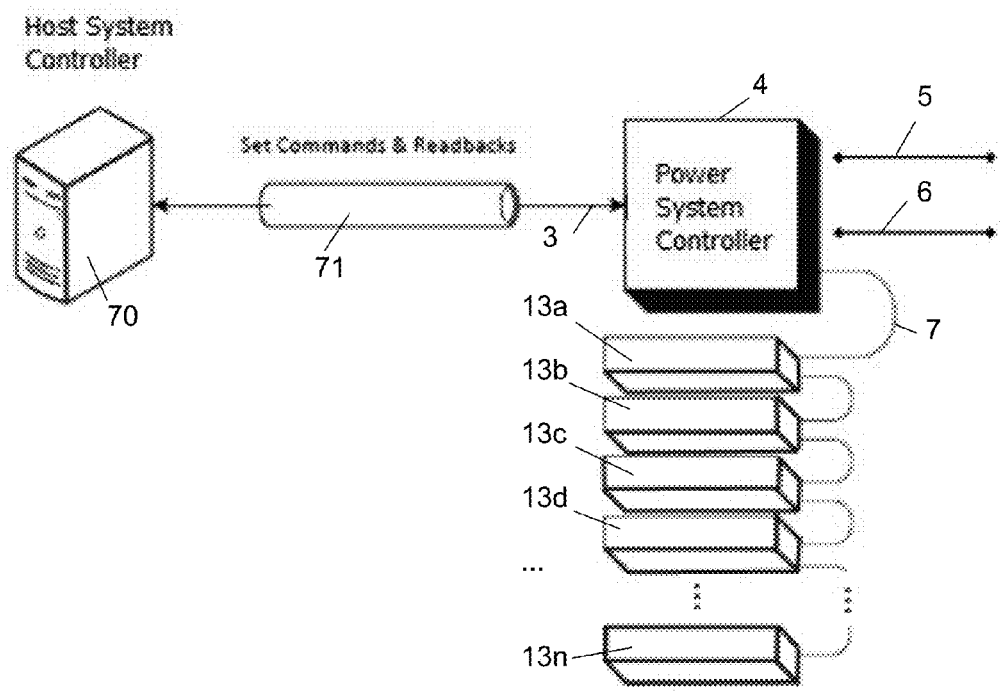
FIG. 7a shows an overview of the arrangement of a control system.

FIG. 7a provides detail of the control system of Block V. As depicted in FIG. 7, the power system controller 4 acts as a portal for communication with the external host 70 through the external system control interface 3. The external host 70 can be connected to the system control interface 3 via one or more or a combination of serial digital, parallel digital, or analog signal connections 71. The connections may be wired or wireless, and might be connected through a local area network (LAN) or wide area network (WAN), or through a global network such as the Internet or private networks. The controller also administers the power conversion modules via a series connected serial digital bus, such as the aforementioned CAN bus.

The controller 4 also acts to control the liquid coolant system through either a control link 6 to the coolant connection, distribution and management system 16, through control of flow valves 63 connected to the power module distribution and collection manifolds described in FIG. 6. The controller 4 can also collect information regarding coolant system pressure through the same link 6 from the pressure sensor 61 depicted in FIG. 6. Optionally, the controller 4 can monitor and/or control an optional heat exchanger through heat exchanger control interface 5.

Figure 7B:
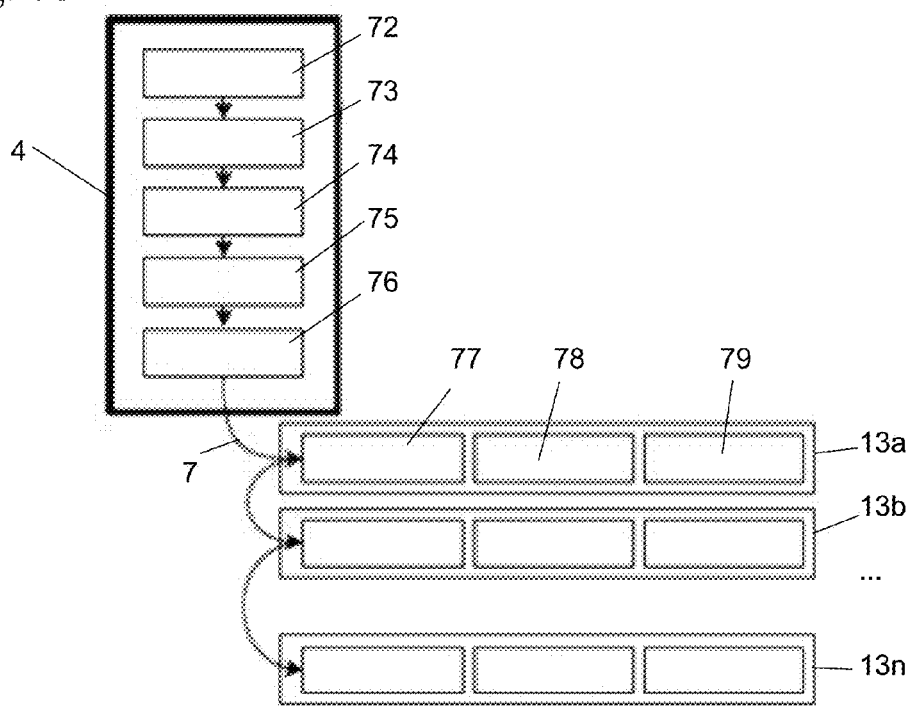

FIG. 7b shows a functional data flow diagram for the power system controller 4. The external system control interface 3 may be connected to an Ethernet Jack 72, which routes data to and from an Ethernet transceiver 73. The Ethernet transceiver 73 communicates bidirectionally with a microcontroller 74, so that commands can be received from, and data sent to, the external system controller 70.

To send commands to, and receive data from, the power conversion modules 13a, 13b . . . 13n, the microprocessor communicates bidirectionally with a CAN transceiver 75. The CAN transceiver 75 is connected to a CAN BUS jack 76, into which the control bus 7 is plugged. All of the power conversion modules 13a-13n are connected to the control bus 7 through a CAN BUS jack 77, through which a CAN transceiver 78 sends and receives data from the bus 7. The CAN transceiver 78 is bidirectionally connected to a microprocessor 79 in the power conversion module 13a-13n, which controls the module and measures various parameters as known to the art.

Block No. VI is an Optional liquid-to-air heat exchanger system. This system provides a means of dissipating heat that is generated by the power conversion process from the coolant connection distribution and management system 16. Depending on system climatic requirements, this heat exchanger can be configured to utilize passive convection/radiation or active refrigeration.

Figure 8A:
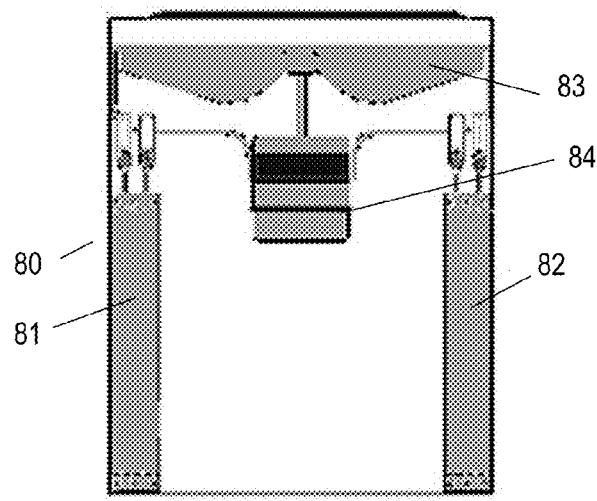
FIG. 8a shows a front view of a coolant system.
Figure 8B:
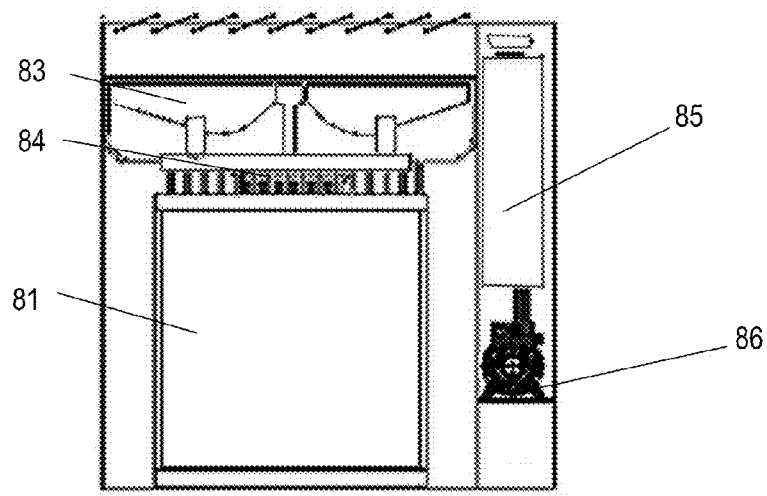
FIG. 8b shows a side view of a coolant system.
Figure 8C:
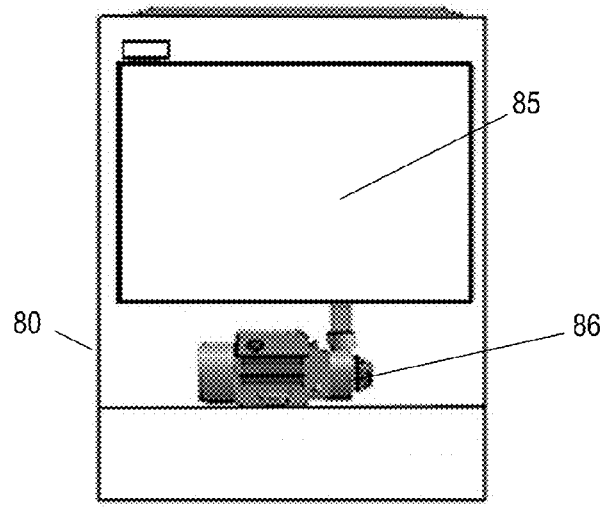
FIG. 8c shows a back view of a coolant system.

FIGS. 8a-8c depicts an example of a heat exchanger sized to accommodate a power system that produces 500 kW of DC power and operates in an ambient temperature of up to 50° C.

The heat exchanger 80 in FIGS. 8a-8c is coupled to the coolant connection, distribution and management system 16. The heat exchanger 80 preferably has an on board coolant reservoir 85 and pump 86. The pump 86 pumps coolant from the reservoir 85 to the to the coolant connection, distribution and management system 16, which distributes it through the coolant supply manifold 8 as described above.

Coolant which was heated by the power conversion modules 13a-13n is returned via coolant return manifold 9 to the coolant connection, distribution and management system 16, which sends the coolant externally to the heat exchanger 80 to discharge heat in the coolant into the ambient environment.

The heat exchanger 80 uses two liquid-to-air heat exchangers 81 and 82 operating in series to dissipate the heat. Operation of these heat exchangers 81 and 82 is optimized through the use of forced air cooling, here shown as a fan 83 powered by motor 84, in which air is drawn through the heat exchangers 81 and 82, cooling the coolant, and then is exhausted through the top of the external heat exchanger 80. After passing through the two heat exchangers 81 and 82, the coolant is returned to the reservoir 85, from which pump 86 will pump it back to the power system to complete the coolant system circuit. Alternatively, the coolant from the heat exchangers 81 and 82 could go directly to pump 86, instead of to the reservoir 85, and the reservoir 85 would be used to maintain the level of the coolant supply as needed. This allows the external heat exchanger 80 to provide for the coolant flow needs of the power system.

When taken all together, the scalable liquid cooled power system can be configured to serve needs as low as 15 kW (or lower), or as high as 500 kW in a single 19" standard NEMA cabinet.

Figure 9:
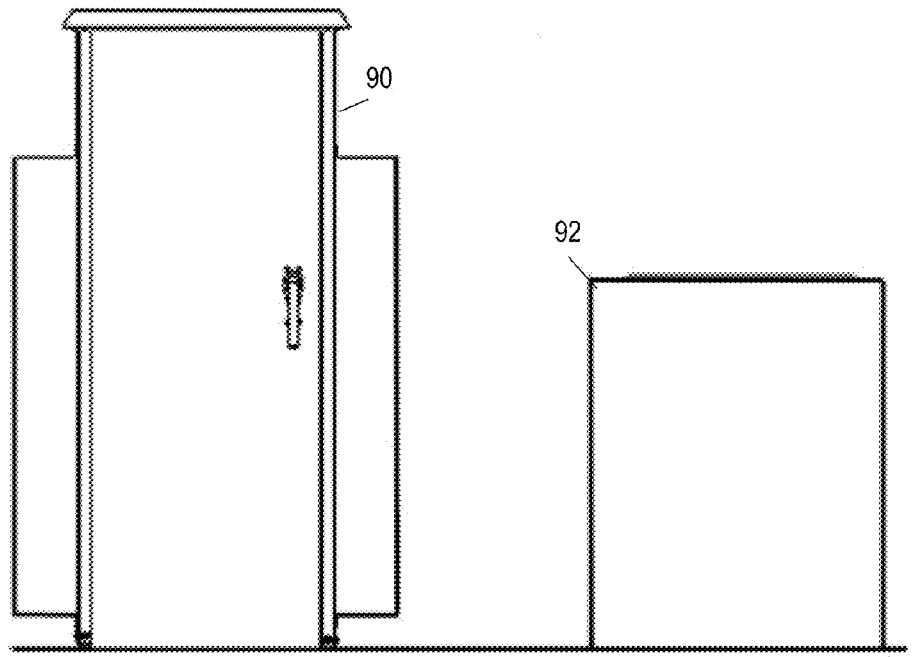
FIG. 9 shows a 500 kW power system.
Figure 10:
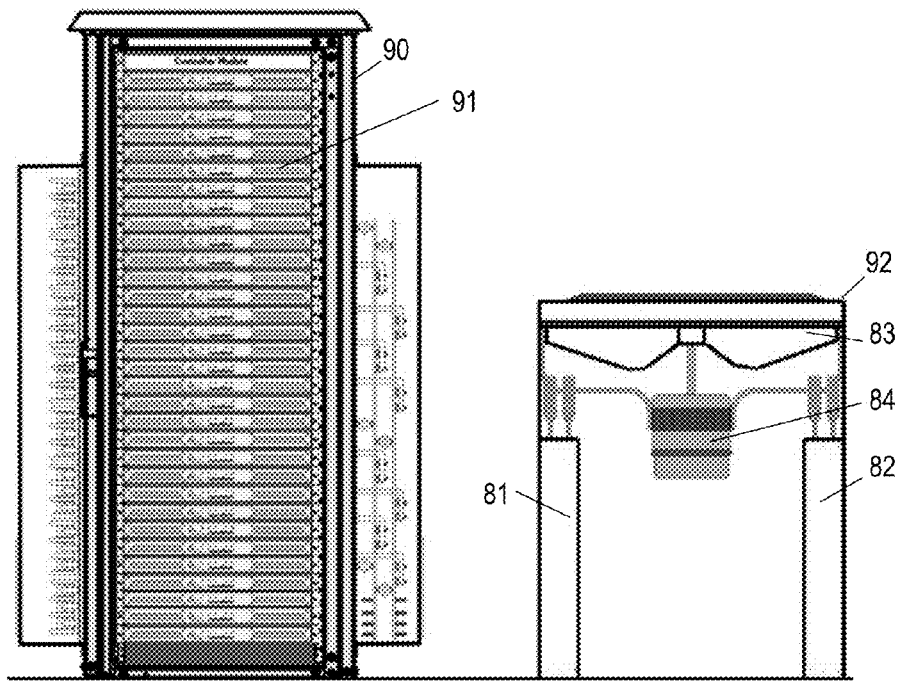
FIG. 10 is a transparent view of the system of FIG. 9.

FIG. 9 presents a sample implementation for a 500 kW system. FIG. 10 shows the elements shown in FIG. 9 with a transparent view.

In the example of FIGS. 9 and 10, there are two cabinets: a rack 90 for the power conversion modules 91, which is preferably a 19" standard NEMA cabinet, and an external heat exchanger 92 as described above in the discussion of FIG. 8.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A modular liquid-cooled power system, comprising:
   a) a plurality of mounting assemblies, each mounting assembly comprising:
      i) a shelf for supporting a power conversion module; and
      ii) a back plane having a plurality of blind-mate connectors;
      iii) the plurality of blind-mate connectors of each of the plurality of mounting assemblies comprising a power input connector, a power output connector, a liquid coolant input connector and a liquid coolant output connector;
   b) a plurality of power conversion modules, each power conversion module being mounted on the shelf of one of the plurality of mounting assemblies, each power conversion module comprising:
      i) a module case having a back panel;
      ii) a plurality of blind-mate connectors on the back panel, each of the plurality of blind-mate connectors on the back panel of the power conversion module being located to mate with one of the plurality of blind-mate connectors on the back plane of the mounting assembly on which the power conversion module is mounted;
      iii) the plurality of blind-mate connectors of each of the plurality of power conversion modules comprising a power input connector mating with a power input connector on the back plane of the mounting assembly, a power output connector mating with a power output connector on the back plane of the mounting assembly, a liquid coolant input connector mating with a liquid coolant input connector on the back plane of the mounting assembly, and a liquid coolant output connector mating with a liquid coolant output connector on the back plane of the mounting assembly;
   c) a liquid coolant system comprising:
      i) a coolant connection distribution and management system having an output for supplying coolant and an input for receiving heated coolant;

ii) a coolant supply manifold coupled to the output of the coolant connection distribution and management system and also being coupled to the liquid coolant input connector on each of the plurality of mounting assemblies;

iii) a coolant return manifold coupled to the input of the coolant connection distribution and management system system and also being coupled to the liquid coolant output connector on the back plane of each of the plurality of mounting assemblies;

such that liquid coolant circulates from the output of the coolant connection distribution and management system to each of the plurality of power conversion modules by flowing through the coolant supply manifold through the mating liquid coolant input connectors on the mounting assemblies and the power conversion modules, the coolant is heated in the power conversion modules, and heated coolant is returned from the power conversion modules through the mating liquid coolant output connectors on the power conversion modules and the liquid coolant output connectors on the mounting assemblies to the coolant return manifold, and through the coolant return manifold to the input of the coolant connection distribution and management system;

d) a power input connection coupled to the power input connectors of each of the plurality of mounting assemblies; and e) an output power connection coupled to the power output connectors of the plurality of mounting assemblies.

2. The modular liquid-cooled power system of claim 1, further comprising an external heat exchanger unit coupled to the liquid coolant distribution and management system.

3. The modular liquid-cooled power system of claim 2, in which the external heat exchanger unit comprises:

a) a liquid coolant input coupled to the liquid coolant distribution and management system;

b) at least one heat exchanger having an input coupled to the liquid coolant input and an output;

c) a coolant pump having an input coupled to the output of the heat exchanger and an output coupled to the the liquid coolant distribution and management system, such that coolant from the liquid coolant distribution and management system is circulated through the at least one heat exchanger, cooled, and returned to the liquid coolant distribution and management system.

4. The modular liquid-cooled power system of claim 3, in which there are two heat exchangers coupled in series.

5. The modular liquid-cooled power system of claim 3, further comprising a fan providing forced air flow over the at least one heat exchanger.

6. The modular liquid-cooled power system of claim 3, further comprising a coolant reservoir coupled between the at least one heat exchanger output and the input of the coolant pump, such that coolant from the at least one heat exchanger flows to the reservoir, and the coolant at the pump input is taken from the reservoir.

7. The modular liquid-cooled power system of claim 1, in which the plurality of blind-mate connectors on each of the plurality of mounting assemblies further comprise a control connector, and the plurality of blind-mate connectors on each of the plurality of power conversion modules further comprise a control connector, the system further comprising a system controller coupled to a bus which is coupled to the control connectors of the plurality of mounting assemblies.

8. The modular liquid-cooled power system of claim 7, in which the system controller has an external system control interface for coupling to an external system controller.

9. The modular liquid-cooled power system of claim 7, in which the bus is a CAN-BUS protocol connection.

10. The modular liquid-cooled power system of claim 1, in which the output power connection comprises bus bars connecting the power output connections of the plurality of mounting assemblies.

* * * * *